(12) United States Patent
Kim et al.

(10) Patent No.: US 8,299,520 B2
(45) Date of Patent: Oct. 30, 2012

(54) SEMICONDUCTOR DEVICES INCLUDING AUXILIARY GATE ELECTRODES AND METHODS OF FABRICATING THE SAME

(75) Inventors: Suk-pil Kim, Gyeonggi-do (KR); Yoon-dong Park, Gyeonggi-do (KR); Jae-young Choi, Gyeonggi-do (KR); June-mo Koo, Seoul (KR); Byung-hee Hong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 271 days.

(21) Appl. No.: 12/544,631

(22) Filed: Aug. 20, 2009

(65) Prior Publication Data

US 2010/0065899 A1    Mar. 18, 2010

(30) Foreign Application Priority Data

Sep. 16, 2008    (KR) .................. 10-2008-0090686

(51) Int. Cl.
  *H01L 29/66*   (2006.01)
  *H01L 29/788*  (2006.01)
  *G11C 16/04*   (2006.01)

(52) U.S. Cl. ............ 257/319; 257/38; 257/39; 257/320; 257/E29.151; 365/185.18; 365/185.05; 977/936; 977/937; 977/938; 977/940; 977/943

(58) Field of Classification Search ............ 257/38, 257/39, E29.151, 319, 320; 977/936, 937, 977/938, 940, 943; 365/185.18, 185.05

See application file for complete search history.

(56) References Cited

U.S. PATENT DOCUMENTS

| | | | | |
|---|---|---|---|---|
| 8,064,254 B2 * | 11/2011 | Kim et al. | ............... | 365/185.05 |
| 2002/0151117 A1 * | 10/2002 | Mutsaers et al. | ............... | 438/149 |
| 2003/0170930 A1 * | 9/2003 | Choi et al. | ....................... | 438/99 |
| 2004/0036128 A1 | 2/2004 | Zhang et al. | | |
| 2005/0029592 A1 * | 2/2005 | Campbell et al. | ............. | 257/347 |
| 2005/0280156 A1 * | 12/2005 | Lee | ............... | 257/758 |
| 2007/0009421 A1 * | 1/2007 | Kittrell et al. | ............... | 423/447.3 |
| 2007/0102747 A1 * | 5/2007 | Chen et al. | ....................... | 257/314 |
| 2007/0200173 A1 * | 8/2007 | Pelley et al. | .................. | 257/347 |
| 2008/0149997 A1 * | 6/2008 | Jin et al. | ......................... | 257/319 |
| 2008/0151631 A1 * | 6/2008 | Hyun et al. | ............. | 365/185.18 |
| 2008/0191264 A1 * | 8/2008 | Kim et al. | ..................... | 257/319 |
| 2008/0242011 A1 * | 10/2008 | Song et al. | ..................... | 438/151 |
| 2010/0176436 A1 * | 7/2010 | Kuo | ............... | 257/319 |

FOREIGN PATENT DOCUMENTS

KR   1020080032685        4/2008
WO   WO 9622616 A1  *   7/1996

* cited by examiner

*Primary Examiner* — N Drew Richards
*Assistant Examiner* — John P Dulka
(74) *Attorney, Agent, or Firm* — Myers Bigel Sibley & Sajovec, P.A.

(57) ABSTRACT

According to some embodiments, a semiconductor device includes first and second auxiliary gate electrodes and a semiconductor layer crossing the first and second auxiliary gate electrodes. A primary gate electrode is provided on the semiconductor layer so that the semiconductor layer is between the primary gate electrode and the first and second auxiliary gate electrodes. Moreover, the first and second auxiliary gate electrodes are configured to induce respective first and second field effect type source/drain regions in the semiconductor layer. Related methods are also discussed.

15 Claims, 12 Drawing Sheets

SEMICONDUCTOR DEVICES INCLUDING AUXILIARY GATE ELECTRODES AND METHODS OF FABRICATING THE SAME

CROSS-REFERENCE TO RELATED APPLICATIONS

This application claims the benefit of Korean Patent Application No. 10-2008-0090686, filed on Sep. 16, 2008, in the Korean Intellectual Property Office, the disclosure of which is incorporated herein in its entirety by reference.

BACKGROUND

The present invention relates to semiconductor devices and methods of fabricating the same.

Semiconductor products are getting smaller in size and may be required to process a high capacity of data. Thus, semiconductor devices used in the semiconductor products may need to provide high integrity. Accordingly, a semiconductor device using a relatively thin semiconductor layer, instead of a bulk semiconductor substrate, may be required.

SUMMARY

According to some embodiments of the present invention, a semiconductor device may include first and second auxiliary gate electrodes, and a semiconductor layer crossing the first and second auxiliary gate electrodes. A primary gate electrode may be provided on the semiconductor layer so that the semiconductor layer is between the primary gate electrode and the first and second auxiliary gate electrodes. More particularly, the first and second auxiliary gate electrodes may be configured to induce respective first and second field effect type source/drain regions in the semiconductor layer.

According to other embodiments of the present invention, a semiconductor device may include a plurality of auxiliary gate electrodes and a semiconductor layer crossing the plurality of auxiliary gate electrodes. A plurality of primary gate electrodes may be provided on the semiconductor layer so that the semiconductor layer is between the plurality of primary gate electrodes and the plurality of auxiliary gate electrodes. In addition, a charge storage layer may be provided between at least one of the plurality of primary gate electrodes and the semiconductor layer. Each of the plurality of auxiliary gate electrodes may be configured to induce a respective field effect type source/drain region in the semiconductor layer between respective adjacent ones of the primary gate electrodes.

According to still other embodiments of the present invention, a method of fabricating a semiconductor device may include forming first and second auxiliary gate electrodes on a substrate, and forming a semiconductor layer on the first and second auxiliary gate electrodes. A primary gate electrode may be formed on the at least one semiconductor layer. Moreover, the first and second auxiliary gate electrodes may be configured to induce respective first and second field effect type source/drain regions in the semiconductor layer.

According to some embodiments of the present invention, a semiconductor device may include at least one semiconductor layer and at least one gate electrode which is disposed on the at least one semiconductor layer. At least one pair of auxiliary gate electrodes may be disposed below the at least one semiconductor layer to induce field effect type source/drain regions in the at least one semiconductor layer.

The at least one pair of the auxiliary gate electrodes and the at least one gate electrode may be separately disposed on both surfaces of the at least one semiconductor layer such that the at least one pair of the auxiliary gate electrodes alternates with the at least one gate electrode.

The semiconductor device may further include source/drain electrodes which are disposed on the at least one semiconductor layer to be respectively connected to the field effect type source/drain regions.

The semiconductor device may further include at least one gate insulating layer disposed between the at least one semiconductor layer and the at least one gate electrode. Furthermore, the semiconductor device may further include at least one auxiliary gate insulating layer which is disposed between the at least one semiconductor layer and the at least one pair of the auxiliary gate electrodes.

The semiconductor device may further include at least one charge storage layer which is disposed between the at least one semiconductor layer and the at least one gate electrode.

The at least one semiconductor layer may include at least one nanowire, at least one nanotube, and/or at least one epitaxial semiconductor layer.

According to other embodiments of the present invention, a semiconductor device may include at least one semiconductor layer and a plurality of gate electrodes which are disposed on the at least one semiconductor layer. At least one charge storage layer may be disposed between the at least one semiconductor layer and the plurality of gate electrodes. A plurality of auxiliary gate electrodes may be disposed below the at least one semiconductor layer to alternate with the plurality of gate electrodes to induce field effect type source/drain regions in the at least one semiconductor layer.

The plurality of gate electrodes may be arranged in a not-and (NAND) structure.

According to still other embodiments of the present invention, a method of fabricating a semiconductor device may include forming at least one pair of auxiliary gate electrodes on a substrate and forming at least one semiconductor layer on the at least one pair of the auxiliary gate electrodes. At least one gate electrode may be formed on the at least one semiconductor layer, and the at least one pair of the auxiliary gate electrodes may be formed to induce field effect type source/drain regions in the at least one semiconductor layer.

BRIEF DESCRIPTION OF THE DRAWINGS

Examples of embodiments of the present invention will be more clearly understood from the following detailed description, taken in conjunction with the accompanying drawings in which.

DETAILED DESCRIPTION

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 1:
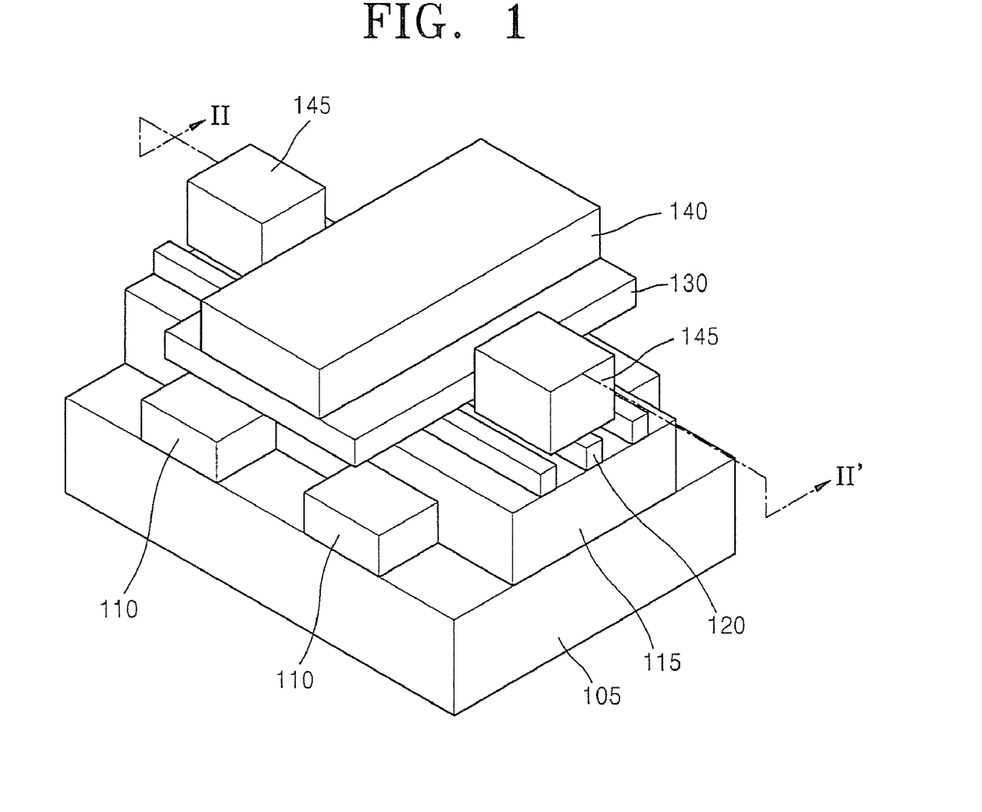
FIG. 1 is a perspective view of a semiconductor device according to some embodiments of the present invention.
Figure 2:
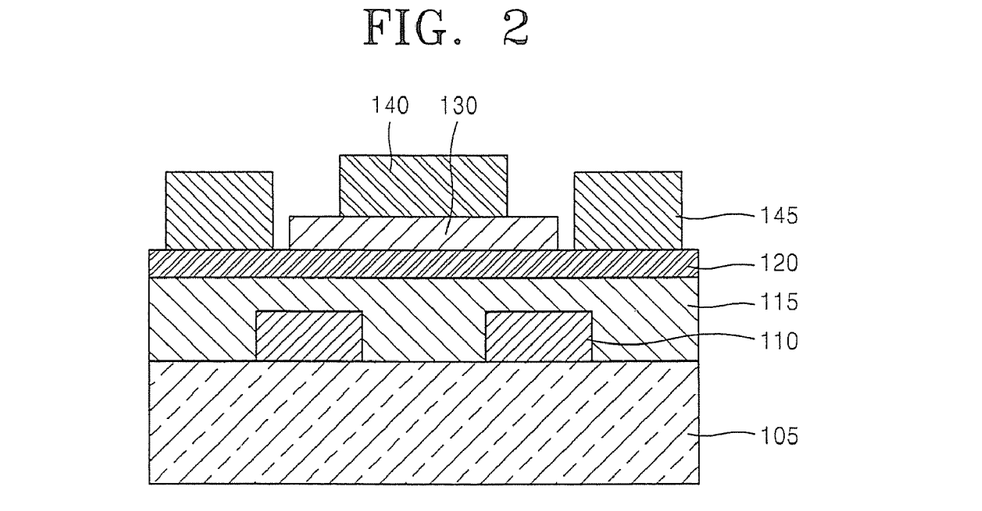
FIG. 2 is a cross-sectional view of the semiconductor device illustrated in FIG. 1, taken along section line II-II'.
Figure 3:
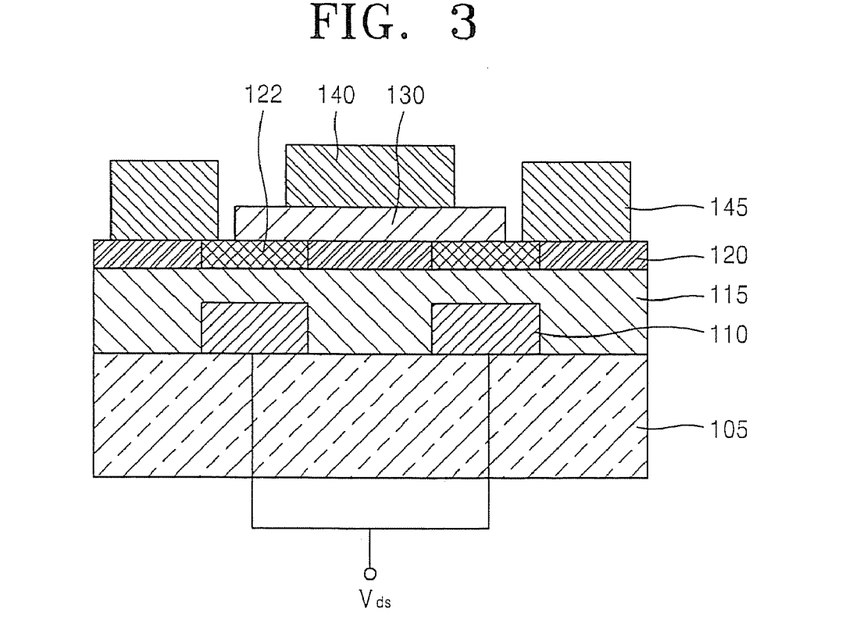
FIG. 3 is a cross-sectional view illustrating operations of the semiconductor device illustrated in FIG. 1.

FIG. 1 is a perspective view of a semiconductor device according to some embodiments of the present invention. FIG. 2 is a cross-sectional view of the semiconductor device illustrated in FIG. 1, taken along a line II-II'. FIG. 3 is a cross-sectional view for illustrating operations of the semiconductor device illustrated in FIG. 1.

Referring to FIGS. 1 and 2, one or more semiconductor layers, i.e., a plurality of semiconductor layers 120, may be formed on a substrate 105. The substrate 105 may include an insulating material. For example, the substrate 105 may be formed as an insulating substrate or a bulk semiconductor substrate on which an insulating material is formed.

The semiconductor layers 120 may be used as conductive channels for charges. For example, the semiconductor layers 120 may be formed of nanowires and/or nanotubes that may be provided by forming a semiconductor material such as carbon (C) into wires or tubes. In general, the nanowires and/or the nanotubes may have widths and/or diameters at a nanometer level. However, the embodiments of the present invention are not limited thereto and the nanowires and/or nanotubes may have minute diameters below the nanometer level. According to other embodiments of the present invention, the semiconductor layers 120 may be formed as epitaxial semiconductor layers. An epitaxial semiconductor layer may be a semiconductor thin film having a monocrystalline structure.

At least one pair of auxiliary gate electrodes 110 may be formed below the semiconductor layers 120. For example, the auxiliary gate electrodes 110 may be formed between the substrate 105 and the semiconductor layers 120 and may extend across the semiconductor layers 120 in a direction orthogonal therewith. At least one auxiliary gate insulating layer 115 may be formed between the auxiliary gate electrodes 110 and the semiconductor layers 120. For example, the auxiliary gate insulating layer 115 may be formed on the substrate 105 to cover the auxiliary gate electrodes 110 and/or portions thereof.

At least one gate electrode 140 may be formed above the semiconductor layers 120. For example, the gate electrode 140 may extend across the semiconductor layers 120. At least one gate insulating layer 130 may be formed between the gate electrode 140 and the semiconductor layers 120.

The gate electrode 140 and the auxiliary gate electrodes 110 may be separately formed on both surfaces of the semiconductor layers 120 so that the auxiliary gate electrodes 110 and the gate electrode 140 are on opposite sides of semiconductor layers 120. Furthermore, the gate electrode 140 and the auxiliary gate electrodes 110 may be alternately formed with respect to each other. For example, the auxiliary gate electrodes 110 may be formed with an interval between the auxiliary gate electrodes 110, and the gate electrode 140 may be formed between the auxiliary gate electrodes 110. Furthermore, some side/edge portions of the auxiliary gate electrodes 110 may separately overlap with opposite side/edge portions of the gate electrode 140.

Referring to FIG. 3, when a source/drain voltage Vds is applied to the auxiliary gate electrodes 110, field effect type source/drain regions 122 may be induced in portions of the semiconductor layers 120 above the auxiliary gate electrodes 110. Thus, the source/drain regions 122 may be inversion regions induced due to the source/drain voltage Vds. These source/drain regions 122 may be different from p-n junction type source/drain regions formed by doping with impurities. Accordingly, the source/drain regions 122 may be induced without doping the semiconductor layers 120 with impurities.

When a semiconductor device according to FIGS. 1-3 operates, the source/drain regions 122 may be electrically connected to channel regions (not shown) which are formed below the gate electrode 140, by aligning the auxiliary gate electrodes 110 (used to induce the formation of the source/drain regions 122) to alternate with the gate electrode 140 used to induce the formation of the channel regions. In this case, some side/edge portions of the auxiliary gate electrodes 110 may separately overlap with opposite side/edge portions of the gate electrode 140 to ensure connection margins. To overlap side/edge portions of the auxiliary gate electrodes 110 with side/edge portions of the gate electrode 140, the gate electrode 140 may be formed on one side of the semiconductor layers 120 and the auxiliary gate electrodes 10 may be formed on the other side of the semiconductor layers 120 opposite to the side on which the semiconductor layers 120 are formed.

Referring back to FIGS. 1 and 2, source/drain electrodes 145 may be formed on the semiconductor layers 120, and may be respectively connected to the source/drain regions 122.

Semiconductor devices according to embodiments of FIGS. 1-3 may provide at least one metal-oxide-semiconductor (MOS) transistor. Furthermore, since the semiconductor layers 120 are not doped with impurities, the semiconductor device may provide a MOS transistor having a multilayer structure as well as a monolayer structure. This MOS transistor may be applied to a logic device and/or a memory device.

Figure 4:
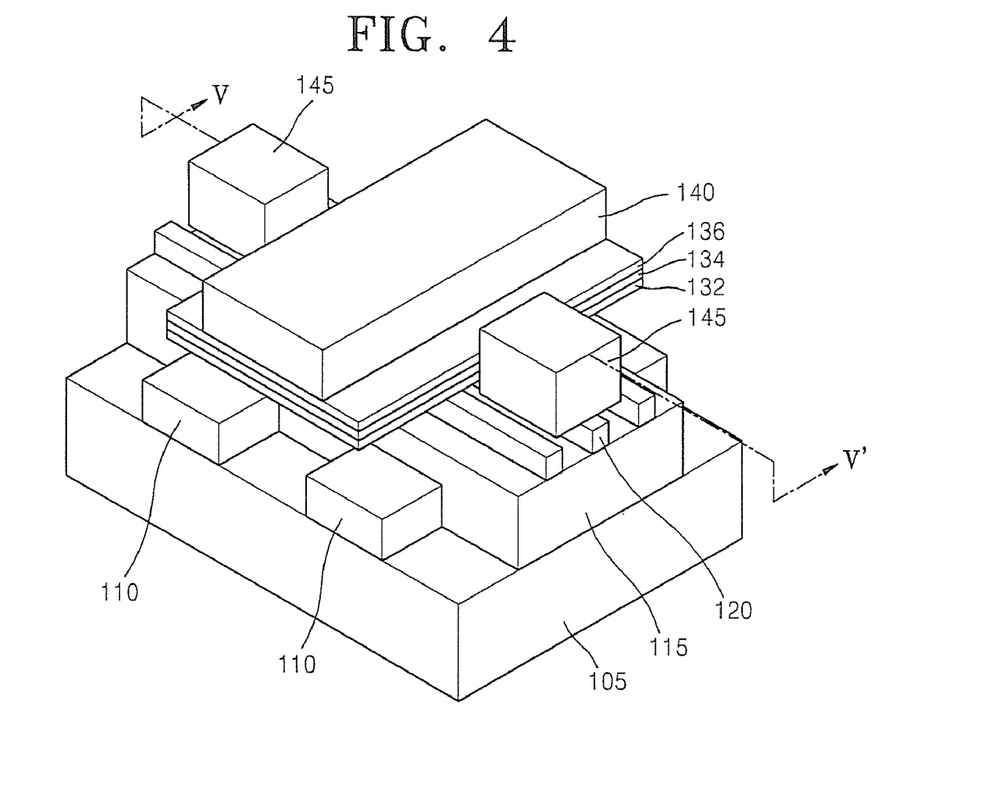
FIG. 4 is a perspective view of a semiconductor device according to other embodiments of the present inventive.
Figure 5:
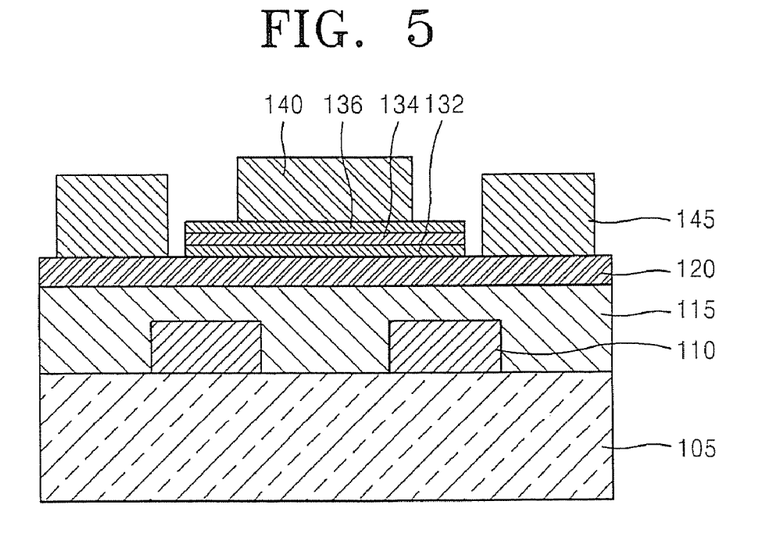
FIG. 5 is a cross-sectional view of the semiconductor device illustrated in FIG. 4, taken along section line V-V'.
Figure 6:
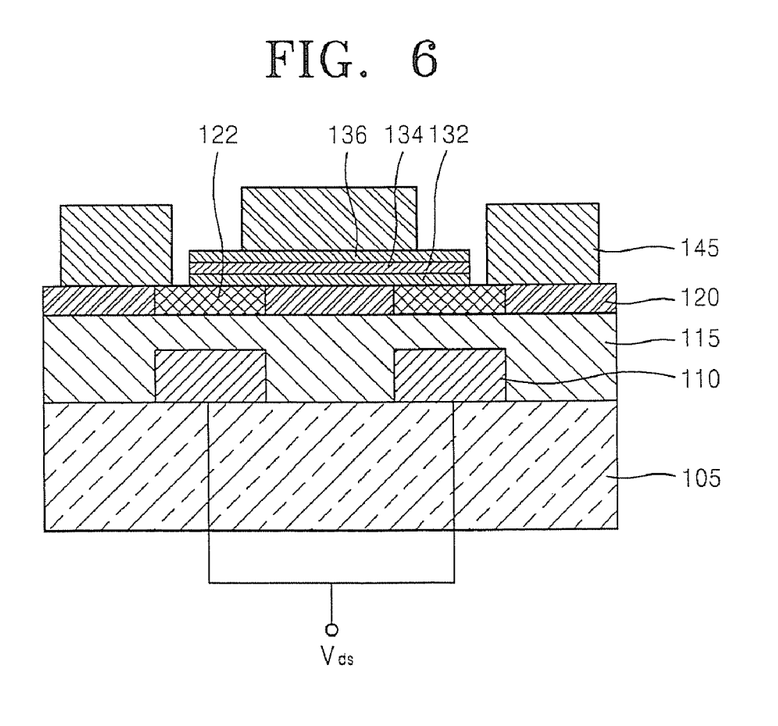
FIG. 6 is a cross-sectional view illustrating operations of the semiconductor device illustrated in FIG. 4.

FIG. 4 is a perspective view of a semiconductor device according to other embodiments of the present invention. FIG. 5 is a cross-sectional view of the semiconductor device illustrated in FIG. 4, taken along section line V-V'. FIG. 6 is a cross-sectional view illustrating operations of the semiconductor device illustrated in FIG. 4. The semiconductor device of FIGS. 4-6 may be implemented by changing the structure of the semiconductor device illustrated in FIGS. 1 through 3 and thus repeated descriptions of identical parts between the semiconductor devices of FIGS. 1 and 4 may be omitted for the sake of conciseness.

Referring to FIGS. 4 and 5, at least one charge storage layer 134 may be formed between semiconductor layers 120 and a gate electrode 140. The charge storage layer 134 may have a capability to store charges, and thus may be used as a data storage medium. A single charge storage layer 134 may extend across the semiconductor layers 120 or separate charge storage layers may be separately formed where the semiconductor layers 120 overlap the gate electrode 140.

For example, the charge storage layer 134 may be a floating type or a trap type charge storage layer according to a charge storage method used. If the charge storage layer 134 is the floating type, the charge storage layer 134 may include a conductive material such as metal and/or polysilicon. If the charge storage layer 134 is the trap type, the charge storage layer 134 may include a silicon nitride layer, quantum dots, and/or nanocrystals. The quantum dots or the nanocrystals may be formed of minute particles of a conductor such as a metal and/or a semiconductor.

At least one tunneling insulating layer 132 may be formed between the semiconductor layers 120 and the charge storage layer 134. At least one blocking insulating layer 136 may be formed between the charge storage layer 134 and the gate electrode 140. Each of the tunneling insulating layer 132 and the blocking insulating layer 136 may be formed of an appropriate insulating material selected from the group consisting of, for example, an oxide, a nitride, a high-k dielectric material, and/or layers formed by stacking two or more of the foregoing materials. According to embodiments of FIGS. 4-6, the high-k dielectric material may be a dielectric material having a higher dielectric constant than oxide or nitride.

Referring to FIG. 6, when a source/drain voltage Vds is applied to auxiliary gate electrodes 110, field effect type source/drain regions 122 may be induced in the semiconductor layers 120 above the auxiliary gate electrodes 110. Accordingly, the source/drain regions 122 may be induced without doping the semiconductor layers 120 with impurities.

While the source/drain regions 122 are being induced, data may be recorded by applying a program voltage to the gate electrode 140 and injecting charges into the charge storage layer 134. The charges may be injected using a hot carrier injection method and/or a Fowler-Nordheim (F-N) tunneling method. The charges stored in the charge storage layer 134 may be removed by applying an erase voltage to the semiconductor layers 120 and using the F-N tunneling method.

The semiconductor device according to embodiments of FIGS. 4-6 may provide at least one memory cell. Accordingly, semiconductor devices according to embodiments of FIGS. 4-6 may be applied to a non-volatile memory device.

Figure 7:
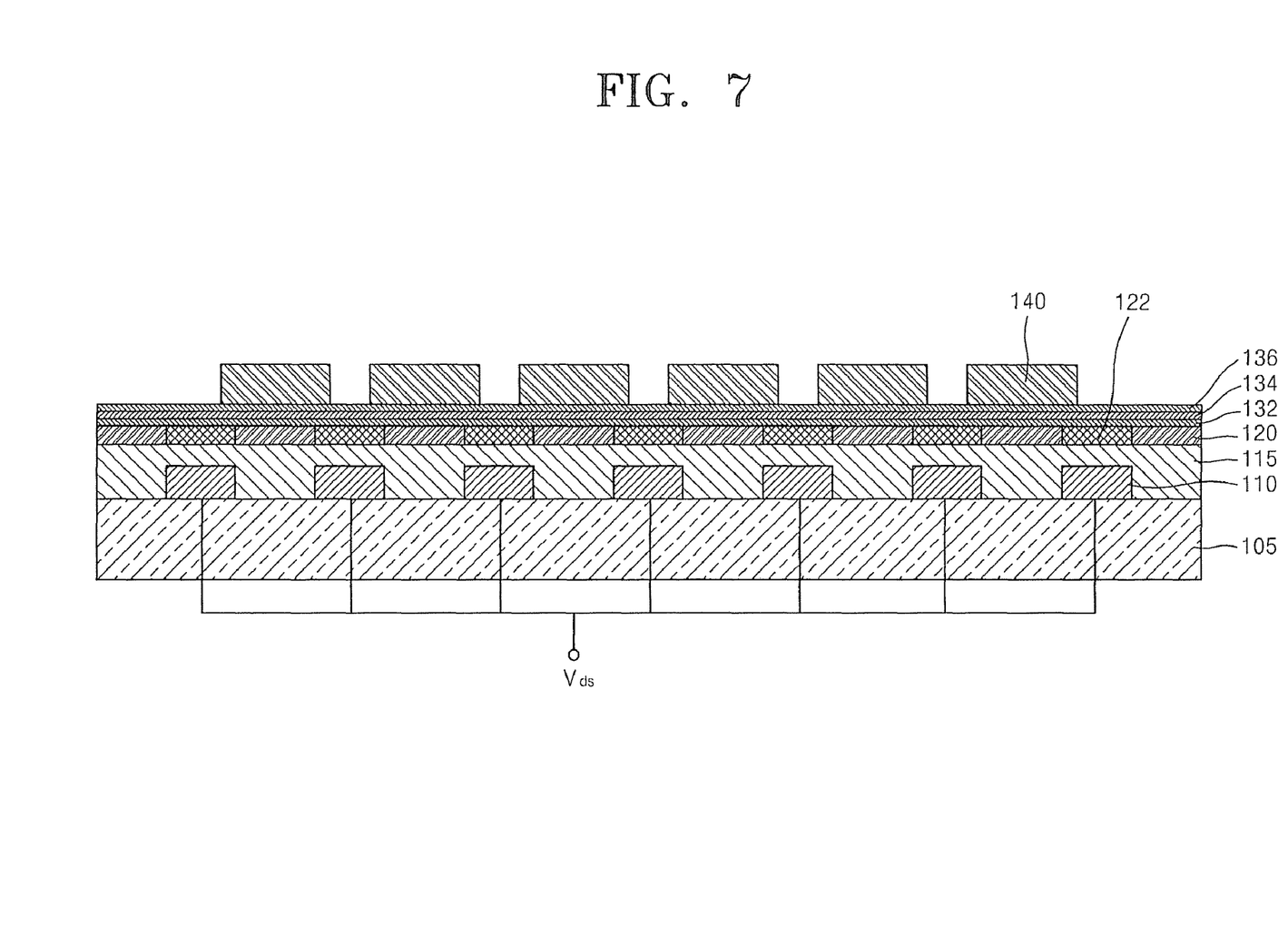
FIG. 7 is a cross-sectional view of a semiconductor device according to still other embodiments of the present invention.

FIG. 7 is a cross-sectional view of a semiconductor device according to other embodiments of the present invention. The semiconductor device of FIG. 7 uses semiconductor device structures illustrated in FIGS. 4 through 6 and thus repeated descriptions of previously discussed elements will be omitted for the sake of conciseness.

Referring to FIG. 7, a plurality of gate electrodes 140 may be formed above semiconductor layers 120. A plurality of auxiliary gate electrodes 110 may be formed below the semiconductor layers 120 so as to alternate with the gate electrodes 140. A tunneling insulating layer 132, a charge storage layer 134, and a blocking insulating layer 136 may be formed between the gate electrodes 140 and the semiconductor layers 120.

According to embodiments of FIG. 7, the gate electrodes 140 may be arranged in a not-and (NAND) structure and thus the semiconductor device may be used as a non-volatile memory device having a NAND structure.

Figure 8:
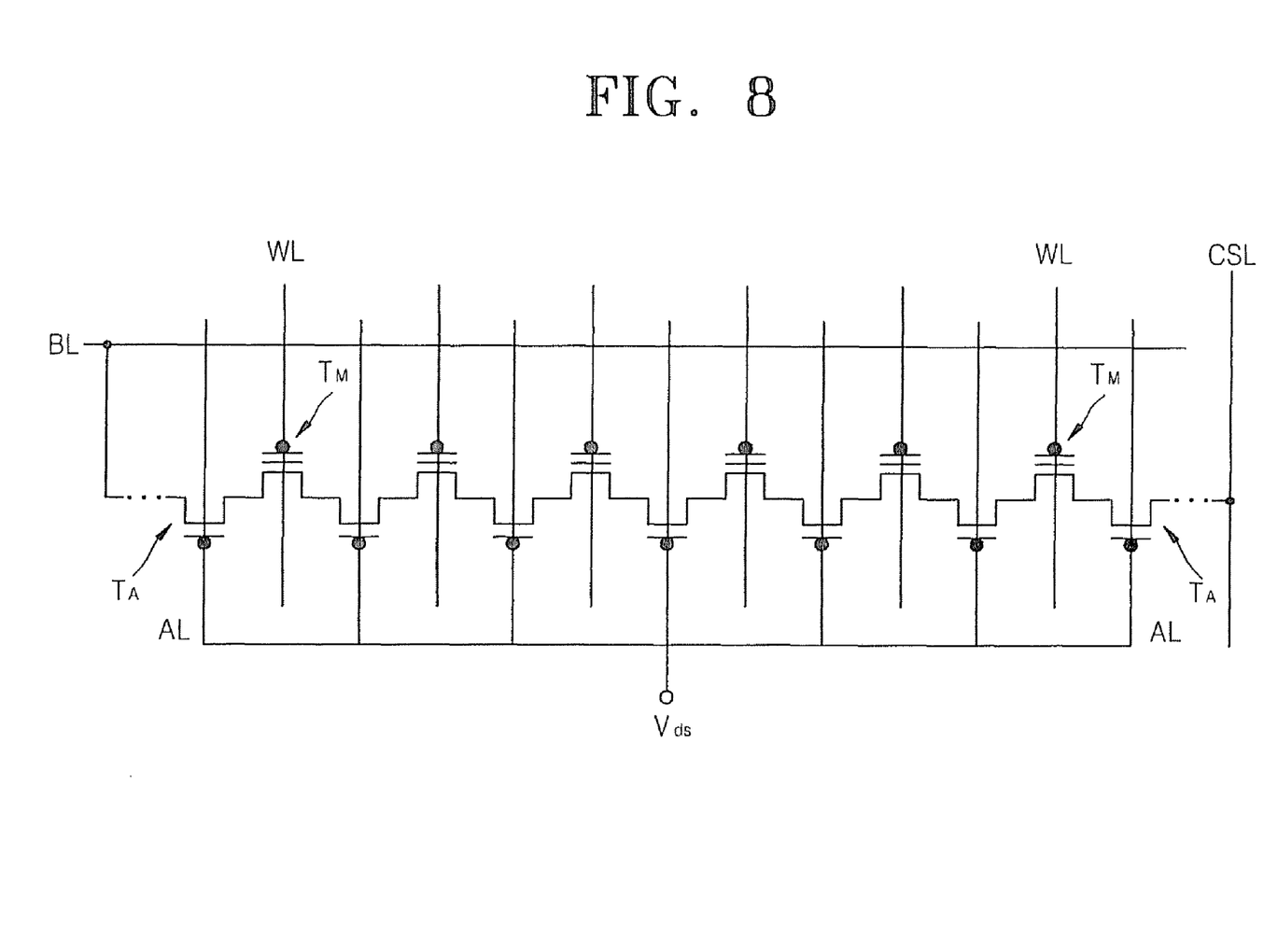
FIG. 8 is an equivalent circuit diagram of the semiconductor device illustrated in FIG. 7.

FIG. 8 is an equivalent circuit diagram of the semiconductor device illustrated in FIG. 7, according to embodiments of the present invention.

Referring to FIGS. 7 and 8, a stacked structure of the semiconductor layer 120 and the gate electrodes 140 may form memory cells $T_M$. A stacked structure of the semiconductor layers 120 and the auxiliary gate electrodes 110 may form auxiliary transistors $T_A$. As such, the memory cells $T_M$ may be arranged between a bit line BL and a common source line CSL in a NAND structure, and each of the auxiliary transistors $T_A$ may be arranged between two neighboring memory cells $T_M$ so as to induce the source/drain regions 122. The number of memory cells $T_M$ and auxiliary transistors $T_A$ are illustrated by way of example in FIG. 8 but embodiments of the present invention are not limited thereto.

The memory cells $T_M$ may be coupled to word lines WL and the auxiliary transistors $T_A$ may be coupled to auxiliary lines AL. The auxiliary lines AL may be connected to each other, and the memory cells $T_M$ may be connected to each other by commonly applying a source/drain voltage Vds to the auxiliary lines AL.

Figure 9:
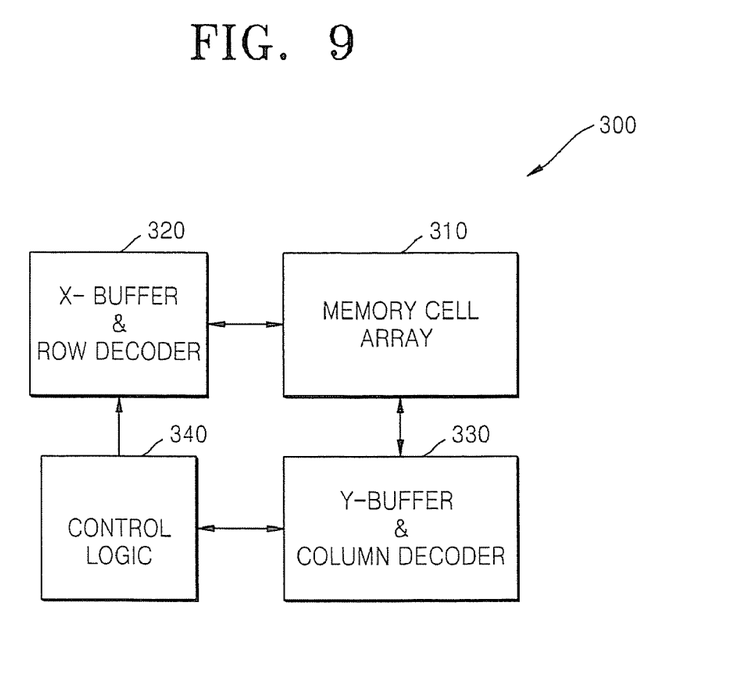
FIG. 9 is a block diagram of a memory chip according to some embodiments of the present invention.

FIG. 9 is a block diagram of a memory chip 300 according to some embodiments of the present invention.

Referring to FIG. 9, a memory cell array 310 may include an array arrangement of memory cells as described above with reference to FIGS. 4 through 8. For example, FIGS. 7 and 8 may correspond to an array arrangement having a single NAND structure. The memory cell array 310 may be connected to an X-buffer & row decoder 320 and a Y-buffer & column decoder 330 to exchange signals with each other. For example, word lines (for example, referring to the word lines WL illustrated in FIG. 8) of the memory cell array 310 may be connected to the X-buffer & row decoder 320, and a bit line (for example, referring to the bit line BL illustrated in FIG. 8) of the memory cell array 310 may be connected to the Y-buffer & column decoder 330. Control logic 340 may be connected to the X-buffer & row decoder 320 and the Y-buffer & column decoder 330 to control the X-buffer & row decoder 320 and the Y-buffer & column decoder 330. Control logic 340 may be further configured to apply source/drain voltage Vds to auxiliary gate electrodes 110 (also referred to as auxiliary lines AL) to temporarily induce field effect type source/drain regions 122 in semiconductor layers 120 without doping source/drain regions differently than other regions of semiconductor layers 120. As shown in FIG. 5, field effect type source/drain regions 122 may not be present when source/drain voltage is not applied to auxiliary gate electrodes 110 by control logic 340, but field effect type source/drain regions 122 may be temporarily induced in semiconductor layers 120 when source/drain voltage Vds is applied by control logic 340 to auxiliary gate electrodes 110.

Figure 10:
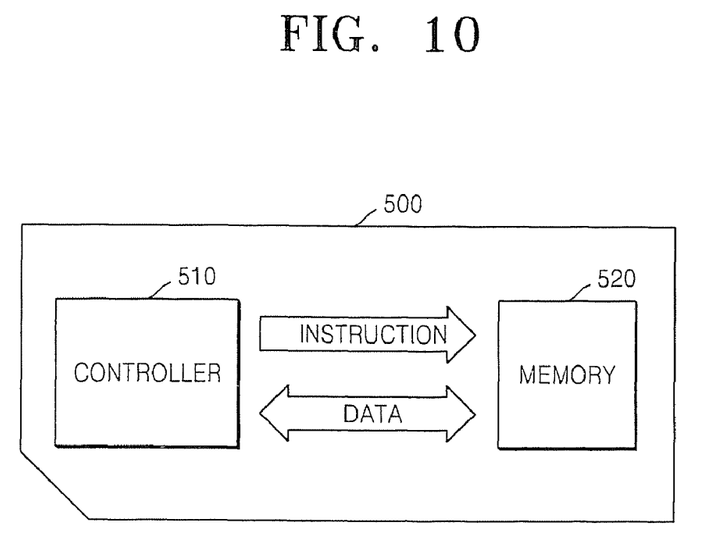
FIG. 10 is a schematic diagram of a memory card according to some embodiments of the present invention.

FIG. 10 is a schematic diagram of a memory card 500 according to some embodiments of the present invention.

Referring to FIG. 10, a controller 510 and a memory 520 may exchange electrical signals. For example, according to an instruction of the controller 510, the controller 510 and the memory 520 may exchange data. As such, the memory card 500 may store data in the memory 520 or may output data from the memory 520. For example, the memory 520 may include the memory chip 300 illustrated in FIG. 9 and/or the controller 510 may include the logic device described above with reference to FIGS. 1 through 3.

The memory card 500 may be used as a data storage medium of various portable devices. For example, the memory card 500 may include a multimedia card (MMC) or a secure digital (SD) card.

Figure 11:
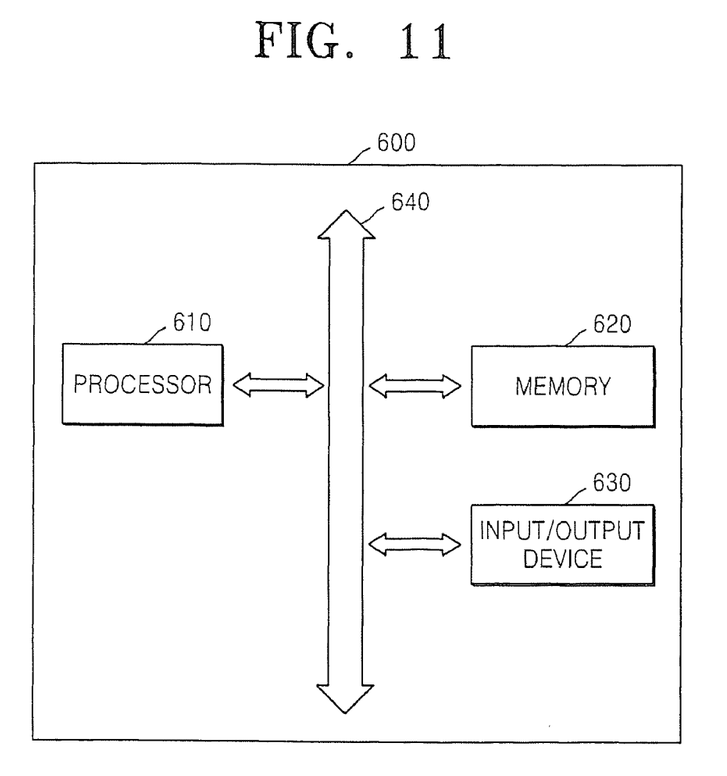
FIG. 11 is a block diagram of an electronic system according to some embodiments of the present invention.

FIG. 11 is a block diagram of an electronic system 600 according to some embodiments of the present invention.

Referring to FIG. 11, a processor 610, an input/output device 630, and a memory 620 may communicate via a bus 640. The processor 610 may execute a program, and may control the electronic system 600. The input/output device 630 may be used to input/output data into/from the electronic system 600. The electronic system 600 may be connected to an external device(s) such as a personal computer (PC) or a network, using the input/output device 630 to communicate with the external device(s).

The memory 620 may store codes and data required/used to operate the processor 610. For example, the memory 620 may include the memory chip 300 illustrated in FIG. 9 and the processor 610 may include the logic device described above with reference to FIGS. 1 through 3. For example, the electronic system 600 may form various electronic control devices using the memory 620 and may be used in, for example, mobile phones, MPEG Audio Layer-3 (MP3) players, navigation systems, solid state disks (SSDs), or household appliances.

FIGS. 12 through 19 are perspective and cross-sectional views used to describe methods of fabricating a semiconductor device, according to some embodiments of the present invention.

Figure 12:
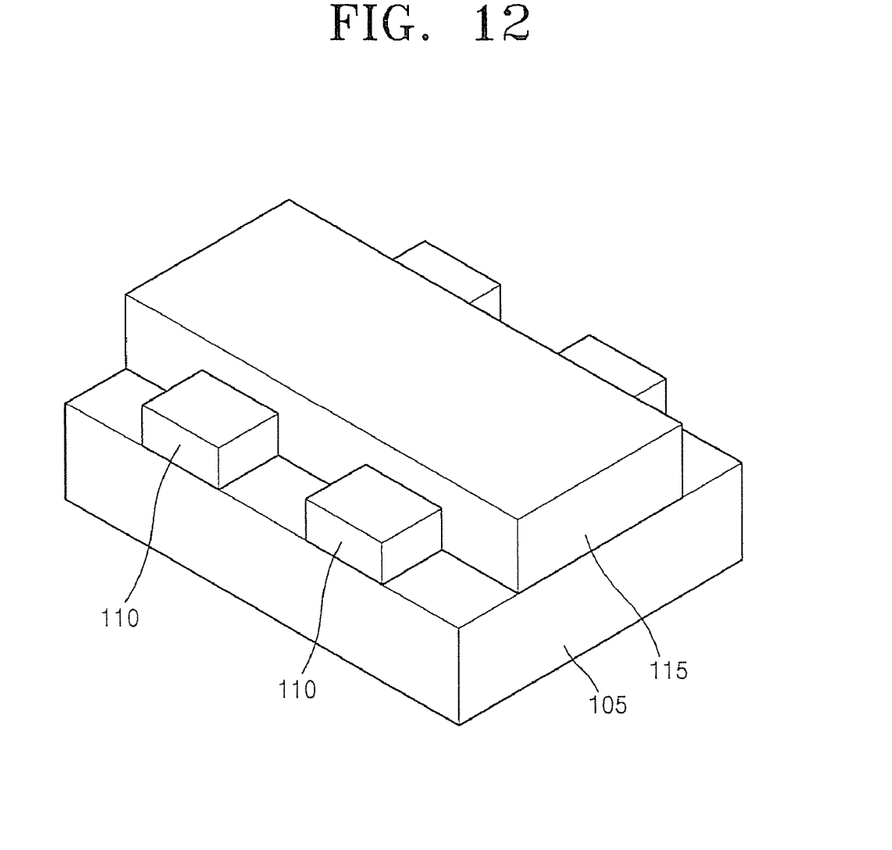
FIGS. 12 through 19 are perspective and cross-sectional views illustrating operations of fabricating a semiconductor device according to some embodiments of the present invention.
Figure 13:
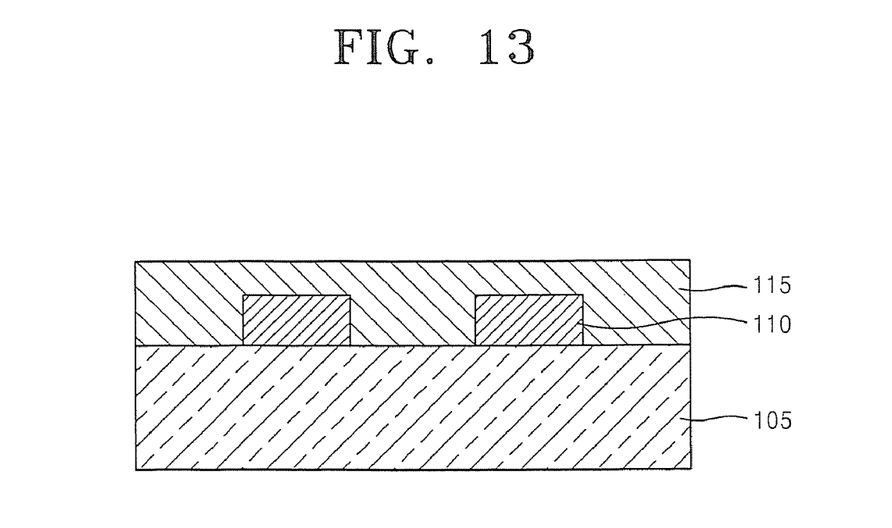

Referring to FIGS. 12 and 13, auxiliary gate electrodes 110 may be formed on a substrate 105. For example, the auxiliary gate electrodes 110 may be formed by forming a conductive layer on the substrate 105, and then, patterning the conductive layer using a photolithography and/or etching methods.

Then, an auxiliary gate insulating layer 115 may be formed on the auxiliary gate electrodes 110. For example, the auxiliary gate insulating layer 115 may be formed on the substrate 105 to cover the auxiliary gate electrodes 110. For example, the auxiliary gate insulating layer 115 may be formed using a chemical vapor deposition (CVD) method and/or an atomic layer deposition (ALD) method.

Figure 14:
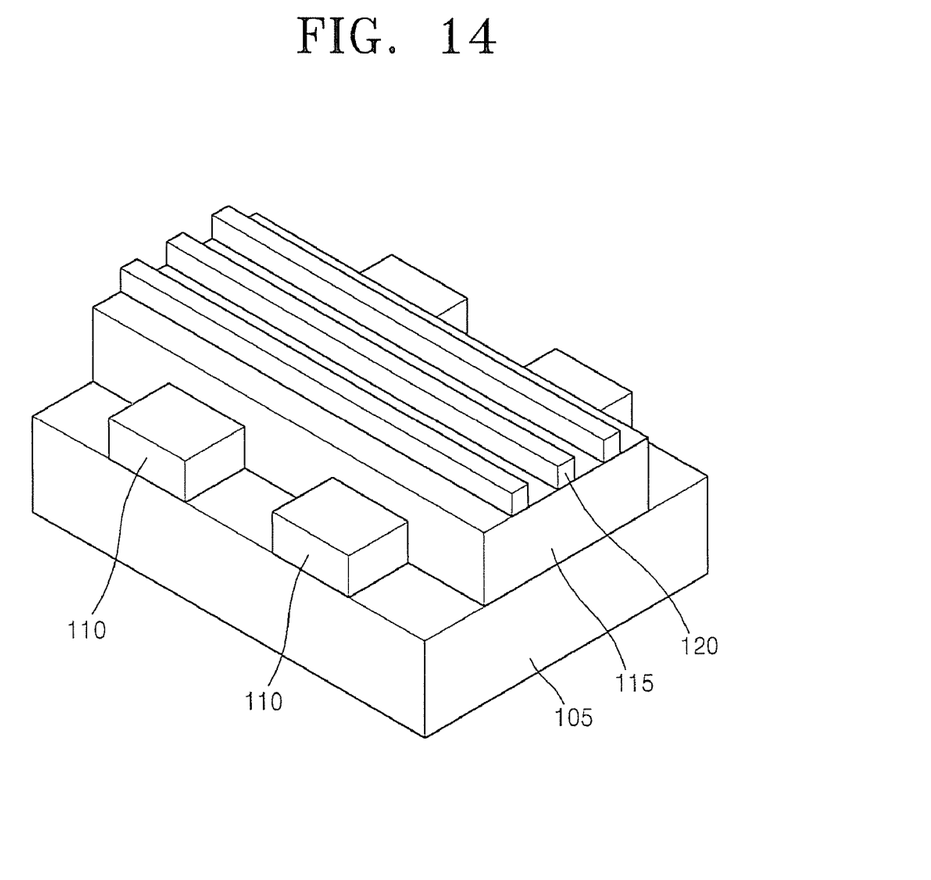
Figure 15:
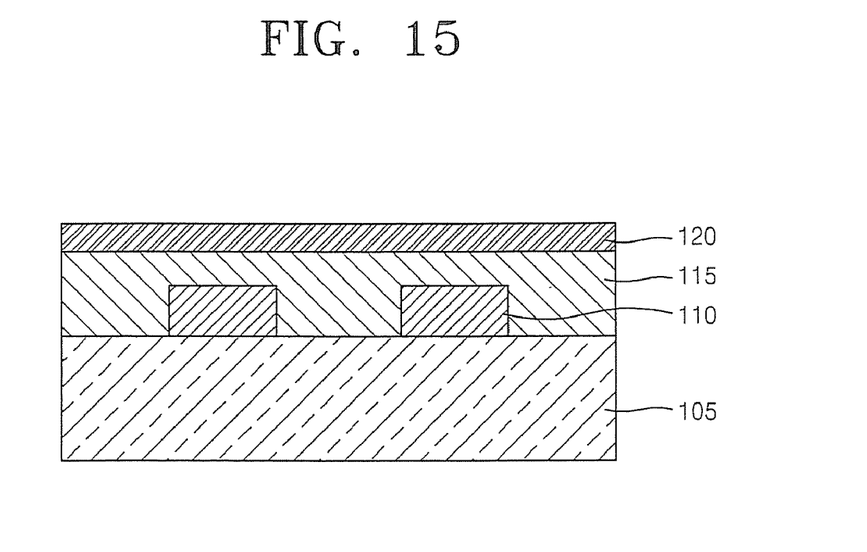

Referring to FIGS. 14 and 15, semiconductor layers 120 may be formed on the auxiliary gate insulating layer 115. For example, the semiconductor layers 120 may be formed by forming nanotubes, nanowires, and/or epitaxial semiconductor layers so that the semiconductor layers 120 extend across the auxiliary gate electrodes 110. A number of semiconductor layers 120 may be appropriately selected according to a capacity of the semiconductor device.

Figure 16:
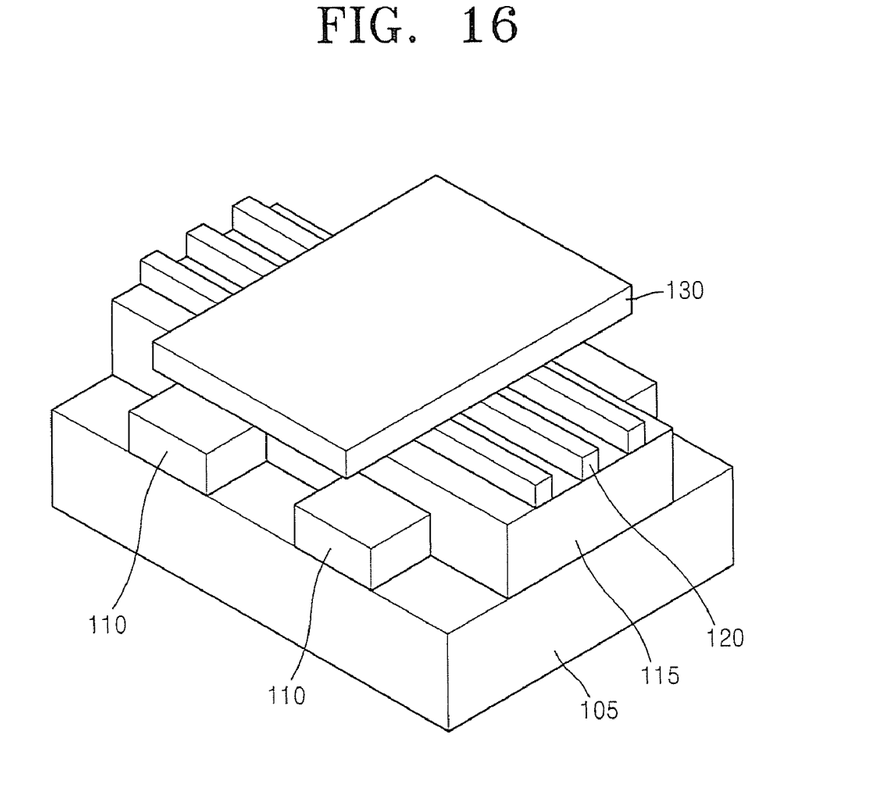
Figure 17:
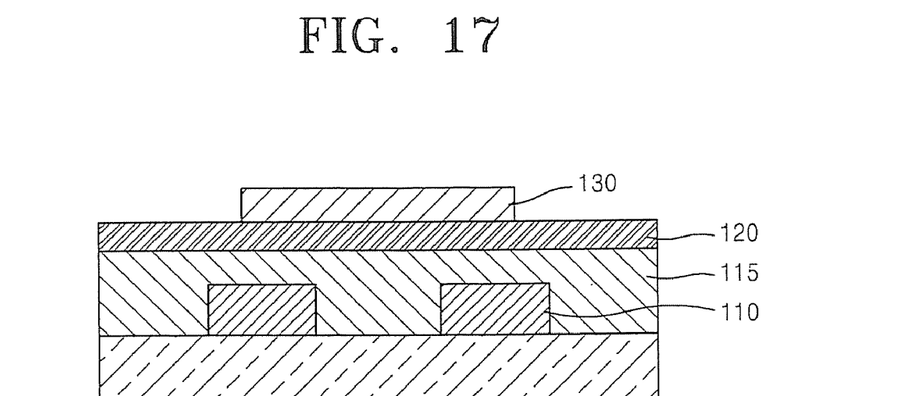

Referring to FIGS. 16 and 17, a gate insulating layer 130 may be formed on the semiconductor layers 120. For example, the gate insulating layer 130 may be formed using a CVD method and/or an ALD method. Selectively, the gate insulating layer 130 may be patterned to an appropriate size.

Figure 18:
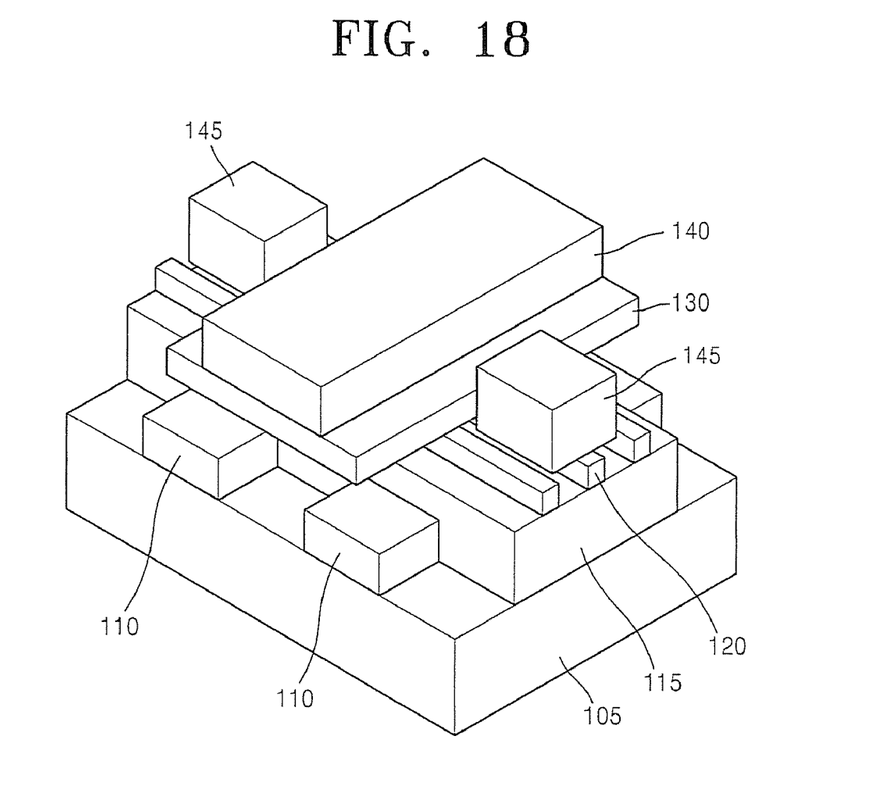
Figure 19:
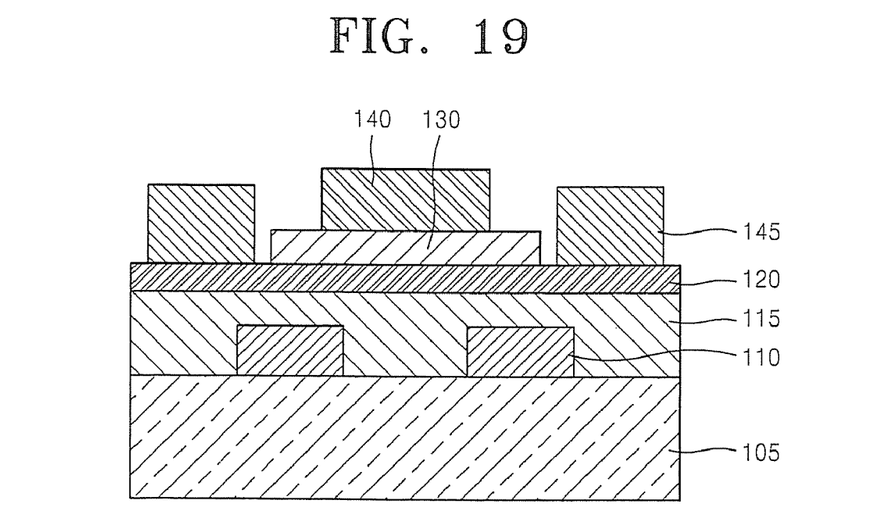

Referring to FIGS. 18 and 19, a gate electrode 140 may be formed on the gate insulating layer 130. For example, the gate electrode 140 may be formed by appropriately forming a conductive layer, and then, patterning the conductive layer. In an alternative, the gate insulating layer 130 and the gate electrode 140 may be patterned at the same time.

Source/drain electrodes 145 may be formed on the semiconductor layers 120 on opposite sides of gate electrode 140.

The source/drain electrodes 145 may be formed by appropriately forming a conductive layer on the semiconductor layers 120, and then, patterning the conductive layer. The gate electrode 140 and the source/drain electrodes 145 may be formed at the same time.

Figure 20:
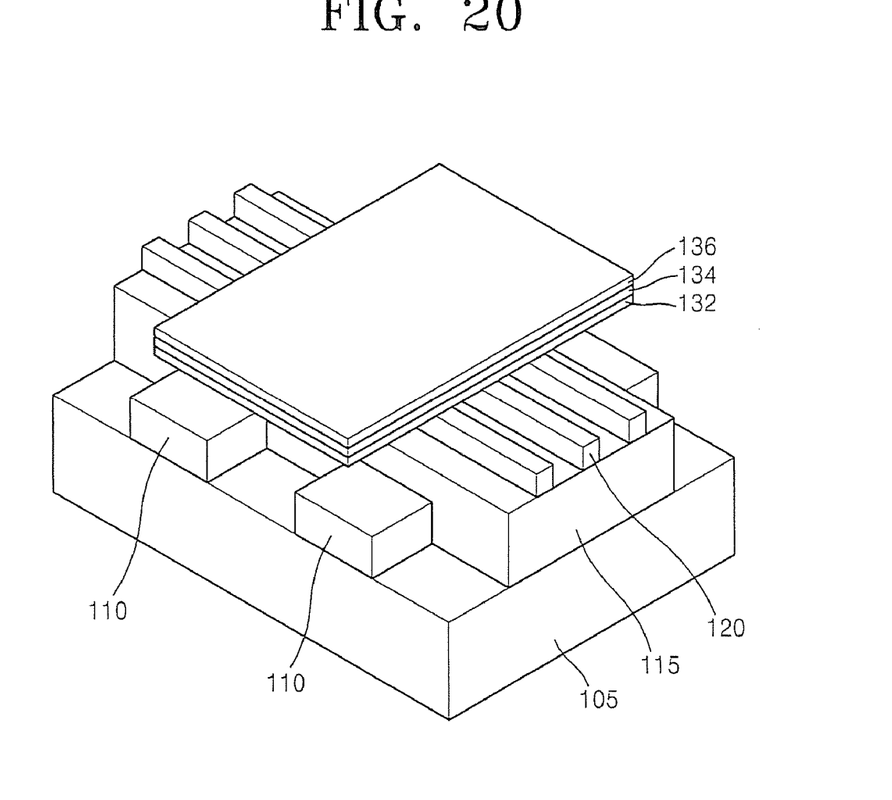
FIGS. 20 and 21 are perspective and cross-sectional views illustrating operations of fabricating a semiconductor device according to other embodiments of the present invention.
Figure 21:
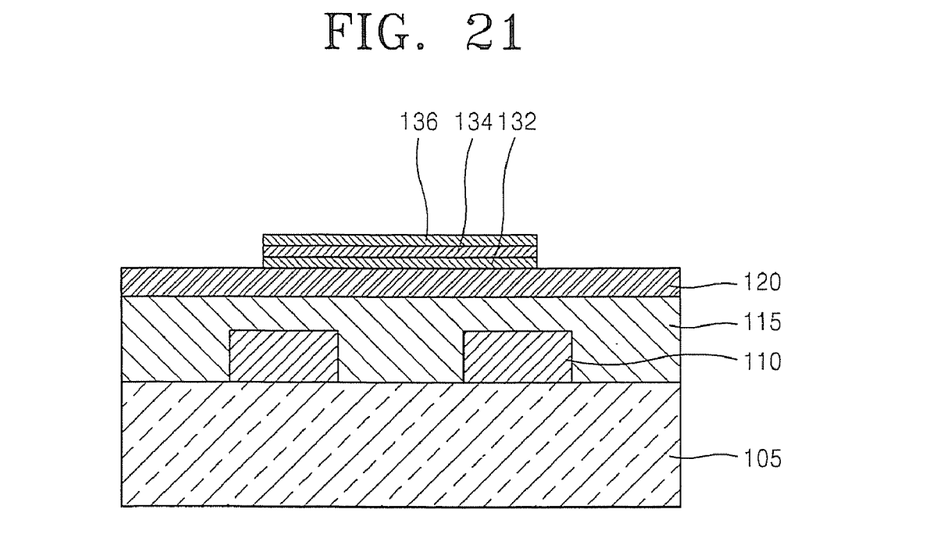

FIGS. 20 and 21 are cross-sectional views used to describe a method of fabricating a semiconductor device, according to other embodiments of the present invention. The method of FIGS. 20 and 21 may be implemented using some operations that are the same as and some operations that are different than those of the method illustrated in FIGS. 12 through 19 and thus repeated descriptions of operations that are the same between the methods may be omitted for the sake of conciseness. The method described with reference to FIGS. 20 and 21 may be performed after the method described with reference to FIGS. 14 and 15 is performed.

Referring to FIGS. 20 and 21, a tunneling insulating layer 132 may be formed on semiconductor layers 120. Then, a charge storage layer 134 may be formed on the tunneling insulating layer 132. Then, a blocking insulating layer 136 may be formed on the charge storage layer 134. The tunneling insulating layer 132, the charge storage layer 134, and the blocking insulating layer 136 may be formed using an appropriate material layer forming method such as a CVD method and/or an ALD method, and an appropriate patterning method.

Then, a gate electrode 140 may be formed on the blocking insulating layer 136 as described above with reference to FIGS. 18 and 19.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A semiconductor device comprising:
   a plurality of at least three auxiliary gate electrodes;
   an auxiliary gate insulating layer on the plurality of at least three auxiliary gate electrodes;
   a continuous semiconductor layer crossing the plurality of at least three auxiliary gate electrodes, wherein the auxiliary gate insulating layer is between the continuous semiconductor layer and the plurality of at least three auxiliary gate electrodes;
   a plurality of primary gate electrodes on the continuous semiconductor layer so that the continuous semiconductor layer is between the plurality of primary gate electrodes and the plurality of auxiliary gate electrodes, wherein each of the plurality of primary gate electrodes is arranged on portions of the continuous semiconductor layer between respective adjacent ones of the plurality of auxiliary gate electrodes;
   a tunnel insulating layer comprising a tunnel insulating material between at least one of the plurality of primary gate electrodes and the continuous semiconductor layer;
   a charge storage layer comprising a charge storage material on the tunnel insulating layer, wherein the charge storage layer is between the at least one of the plurality of primary gate electrodes and the tunnel insulating layer, and wherein the tunnel insulating material and the charge storage material comprise different materials; and
   a blocking insulating layer comprising a blocking insulating material on the charge storage layer, wherein the blocking insulating layer is between the at least one of the plurality of primary gate electrodes and the charge storage layer, and wherein the charge storage material and the blocking insulating material comprise different materials;
   wherein each of the plurality of auxiliary gate electrodes is configured to induce a respective field effect type source/drain region in the continuous semiconductor layer between respective adjacent ones of the primary gate electrodes; and
   wherein a space between the continuous semiconductor layer and each of the plurality of at least three auxiliary gate electrodes is free of the charge storage material.

2. The semiconductor device of claim 1 wherein the plurality of primary gate electrodes are arranged in a not-and (NAND) structure along the continuous semiconductor layer.

3. The semiconductor device of claim 1, wherein edge portions of each of the plurality of primary gate electrodes overlap edge portions of the respective adjacent ones of the plurality of auxiliary gate electrodes.

4. The semiconductor device of claim 1 further comprising:
   a substrate such that the plurality of auxiliary gate electrodes are between the continuous semiconductor layer and the substrate.

5. The semiconductor device of claim 1 further comprising:
   first and second electrodes electrically coupled to the continuous semiconductor layer on opposite sides of the plurality of primary gate electrodes so that the plurality of primary gate electrodes are between the first and second electrodes.

6. The semiconductor device of claim 1 wherein the continuous semiconductor layer comprises an epitaxial semiconductor layer.

7. The semiconductor device of claim 1 wherein the continuous semiconductor layer comprises at least one of a nanowire and/or a nanotube.

8. The semiconductor device of claim 1 further comprising:
   control logic coupled to the plurality of auxiliary gate electrodes, wherein the plurality of auxiliary gate electrodes are configured to temporarily induce respective field effect type source/drain regions in the continuous semiconductor layer at the same time responsive to a source/drain voltage applied by the control logic to the plurality of auxiliary electrodes.

9. A semiconductor device comprising:
   a plurality of at least three auxiliary gate electrodes;
   a continuous semiconductor layer crossing the plurality of at least three auxiliary gate electrodes;
   a plurality of primary gate electrodes on the continuous semiconductor layer so that the continuous semiconductor layer is between the plurality of primary gate electrodes and the plurality of auxiliary gate electrodes, wherein each of the plurality of primary gate electrodes is arranged on portions of the continuous semiconductor layer between respective adjacent ones of the plurality of auxiliary gate electrodes wherein each of the plurality of auxiliary gate electrodes is configured to induce a respective field effect type source/drain region in the continuous semiconductor layer between respective adjacent ones of the primary gate electrodes; and
   a charge storage layer between at least one of the plurality of primary gate electrodes and the continuous semiconductor layer;
   wherein the continuous semiconductor layer comprises at least one of a nanowire and/or a nanotube.

10. The semiconductor device of claim 9 wherein the plurality of primary gate electrodes are arranged in a not-and (NAND) structure along the continuous semiconductor layer.

11. The semiconductor device of claim 9, wherein edge portions of each of the plurality of primary gate electrodes overlap edge portions of the respective adjacent ones of the plurality of auxiliary gate electrodes.

12. The semiconductor device of claim 9 further comprising:
a substrate such that the plurality of auxiliary gate electrodes are between the continuous semiconductor layer and the substrate.

13. The semiconductor device of claim 9 further comprising:
first and second electrodes electrically coupled to the continuous semiconductor layer on opposite sides of the plurality of primary gate electrodes so that the plurality of primary gate electrodes are between the first and second electrodes.

14. The semiconductor device of claim 9 wherein the continuous semiconductor layer comprises an epitaxial semiconductor layer.

15. The semiconductor device of claim 9 further comprising:
control logic coupled to the plurality of auxiliary gate electrodes, wherein the plurality of auxiliary gate electrodes are configured to temporarily induce respective field effect type source/drain regions in the continuous semiconductor layer at the same time responsive to a source/drain voltage applied by the control logic to the plurality of auxiliary electrodes.

* * * * *